(12) United States Patent
Konno et al.

(10) Patent No.: US 7,868,612 B2
(45) Date of Patent: Jan. 11, 2011

(54) MAGNETIC SENSOR MODULE

(75) Inventors: Toshiaki Konno, Miyagi-ken (JP); Naoki Kitaura, Miyagi-ken (JP); Nobuaki Haga, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/707,263

(22) Filed: Feb. 17, 2010

(65) Prior Publication Data
US 2010/0141250 A1 Jun. 10, 2010

Related U.S. Application Data

(63) Continuation of application No. PCT/JP2008/066292, filed on Sep. 10, 2008.

(30) Foreign Application Priority Data
Sep. 10, 2007 (JP) .............................. 2007-233820

(51) Int. Cl.
G01B 7/14 (2006.01)
G01R 33/05 (2006.01)
H01L 23/48 (2006.01)

(52) U.S. Cl. ...................... 324/244; 324/260; 324/262; 257/784

(58) Field of Classification Search ................. 324/244, 324/260, 262; 257/784
See application file for complete search history.

(56) References Cited

FOREIGN PATENT DOCUMENTS

| JP | 2000-155922 | 6/2000 |
|----|-------------|--------|
| JP | 2002-215428 | 8/2002 |
| JP | 2007-178203 | 7/2007 |

*Primary Examiner*—Reena Aurora
(74) *Attorney, Agent, or Firm*—Brinks Hofer Gilson & Lione

(57) ABSTRACT

In a magnetic sensor module, using die-bond resin as a joining material, a Z-axis magnetic sensor is mounted onto a substrate having a wire formed on its principal surface. The Z-axis magnetic sensor having electrode pads formed on its bottom surface is tilted by 90 degrees and mounted onto the substrate. Therefore, the electrode pads are positioned at a side surface thereof. A joining material accommodation area which the die-bond resin can fill is provided at the surface of the Z-axis magnetic sensor opposing the principal surface of the substrate. This joining material accommodation area has a grooved structure. At the surface of the Z-axis magnetic sensor opposing the principal surface of the substrate, the grooved structure is provided at an end portion near the wire formed on the substrate.

3 Claims, 5 Drawing Sheets

MAGNETIC SENSOR MODULE

This application is a Continuation of International Application No. PCT/JP2008/066292 filed on Sep. 10, 2008, which claims benefit of the Japanese Patent Application No. 2007-233820 filed on Sep. 10, 2007, both of which are hereby incorporated by reference.

BACKGROUND

1. Field of the Invention

The present invention relates to a magnetic sensor module used in, for example, an electronic compass.

2. Discussion of the Related Art

An electronic compass including a magnetic sensor that detects geomagnetism detects the geomagnetism by, for example, an X-axis magnetic sensor, a Y-axis magnetic sensor, and a Z-axis magnetic sensor. In such an electronic compass, an IC and a magnetic sensor are mounted on a substrate, and the IC and the magnetic sensor are electrically connected to each other. The magnetic sensor is ordinarily designed so as to have a sensitivity axis in only one direction, and has a substantially rectangular parallelepiped shape. Therefore, in order to mount three magnetic sensors on the same substrate, it is necessary to tilt one magnetic sensor or two magnetic sensors by 90 degrees and to set its sensitivity axis or their sensitivity axes orthogonally to the other magnetic sensor or magnetic sensors.

If a magnetic sensor is tilted by 90 degrees in this way, as shown in FIG. 4A, electrode pads 32 that are ordinarily formed at the bottom surface of a magnetic sensor 31 so as to be mounted to a surface of a substrate are positioned at a side surface thereof. In this case, a corner bump bonding method that electrically connects the electrode pads, which are positioned at the side surface of the component, and wires, which are formed on the surface of the substrate, to each other is used (Japanese Unexamined Patent Application Publication No. 2000-155922).

In manufacturing the magnetic sensor 31, after forming many elements on a wafer, the elements are divided into separate elements by dicing. In this case, as shown in FIG. 4B, it is necessary to provide a distance X from a peripheral edge of the magnetic sensor 31 to the electrode pads 32 so that chipping Y occurring during the dicing does not influence the electrode pads 32. If the distance X from the peripheral edge of the magnetic sensor 31 to the electrode pads 32 is provided, as shown in FIG. 5, the distance between a wire 34, formed on a substrate 33, and the electrode pads 32, provided at the magnetic sensor 31, is increased. As a result, it is necessary to increase the outside diameter of bumps 36 that electrically connect the wire 34 and the electrode pads 32 to each other. If the outside diameter of the bumps 36 is increased, it is necessary to increase the pitch between the electrode pads 32 for preventing short-circuiting between the bumps 36. This results in the problem that a magnetic sensor module cannot be reduced in size.

BRIEF SUMMARY

The present invention is carried out in view of the aforementioned points, and provides a magnetic sensor module which can be reduced in size with a magnetic sensor and a substrate being electrically connected to each other by corner bump bonding.

According to the present invention, there is provided a magnetic sensor module including a substrate, a magnetic sensor, and a second joining material. The substrate has a wire on a principal surface thereof. The magnetic sensor has an electrode pad formed on one surface thereof, is mounted on the principal surface of the substrate using a first joining material so that another surface thereof orthogonal to the one surface opposes the principal surface of the substrate, and has a joining material accommodation area that is situated between the electrode pad and the another surface and that is capable of being filled with the first joining material. The second joining material electrically connects the wire and the electrode pad to each other.

According to this structure, the electrode pads and the wire can be brought close to each other. Therefore, it is possible to reduce the size of the second joining material, and to reduce the pitch between the electrode pads. As a result, it is possible to reduce the size of the magnetic sensor and the magnetic sensor module.

In the magnetic sensor module according to the present invention, the joining material accommodation area may be formed so as to have a grooved structure provided at an end portion near the wire.

In the magnetic sensor module according to the present invention, the magnetic sensor may have a sensitivity axis in a direction substantially orthogonal to the principal surface.

In the magnetic sensor module according to the present invention, a thickness of the wire may be greater than a length equal to the sum of a distance from the electrode pad to the joining material accommodation area and a thickness of the first joining material.

The magnetic sensor module according to the present invention includes a substrate, a magnetic sensor, and a second joining material. The substrate has a wire on a principal surface thereof. The magnetic sensor has an electrode pad formed on one surface thereof, is mounted on the principal surface of the substrate using a first joining material so that another surface thereof orthogonal to the one surface opposes the principal surface of the substrate, and has a joining material accommodation area that is situated between the electrode pad and the another surface and that is capable of being filled with the first joining material. The second joining material electrically connects the wire and the electrode pad to each other. Therefore, it is possible to reduce the size of the magnetic sensor module with the magnetic sensor and the substrate being electrically connected to each other by corner bump bonding.

DETAILED DESCRIPTION OF THE DRAWINGS AND THE PRESENTLY PREFERRED EMBODIMENTS

An embodiment of the present invention will hereunder be described in detail with reference to the attached drawings.

Figure 1:
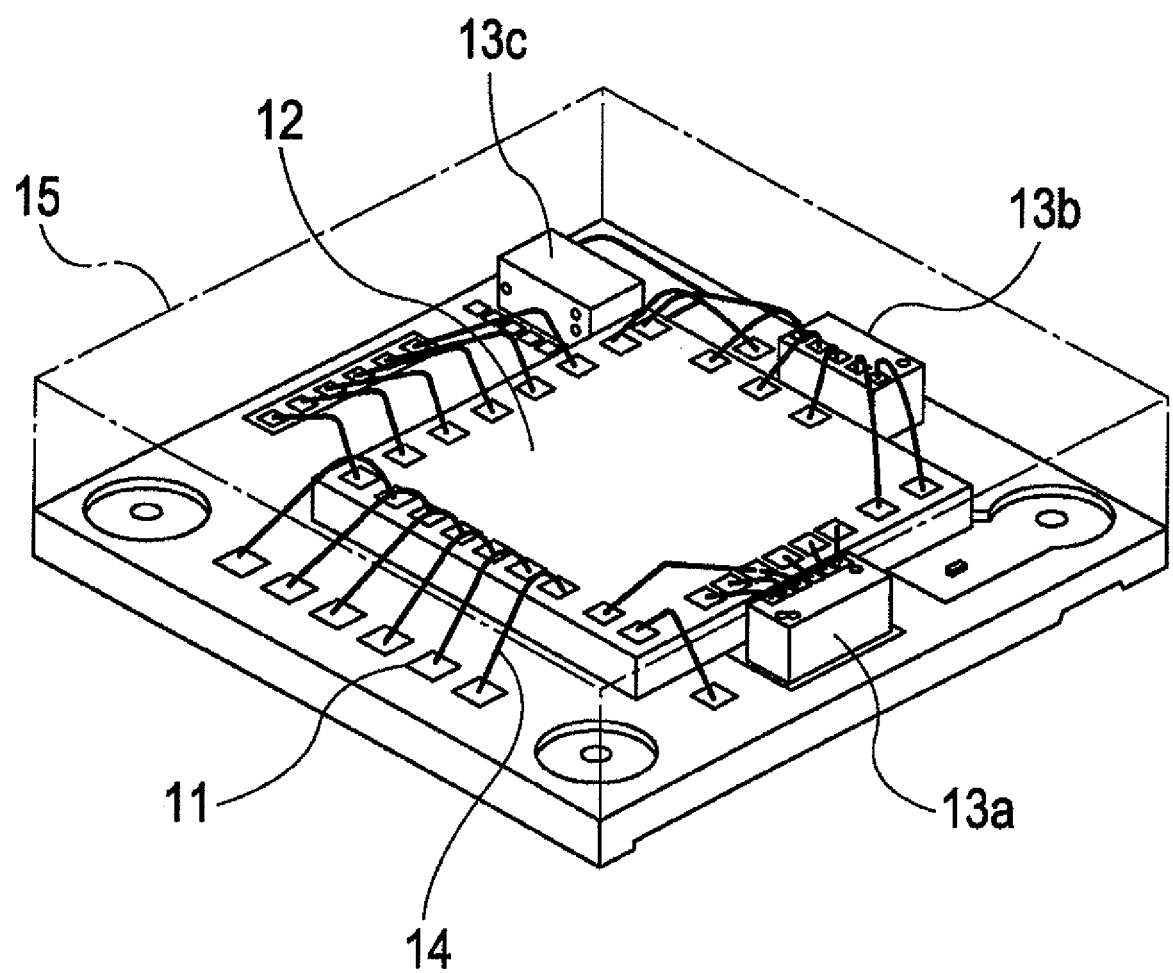
FIG. 1 is a perspective view of a magnetic sensor package including a magnetic sensor module according to an embodiment of the present invention.

FIG. 1 is a perspective view of a package including a magnetic sensor module according to an embodiment of the present invention. The magnetic sensor module shown in FIG. 1 includes an interposer, which is a substrate 11. The substrate 11 has a pair of opposing principal surfaces, with an IC 12 being mounted on one of the principal surfaces. An X-axis magnetic sensor 13a, a Y-axis magnetic sensor 13b, and a Z-axis magnetic sensor 13c are mounted to the same principal surface. Although, in the embodiment, the case in which three magnetic sensors are mounted to the substrate 11 is described, in the present invention, at least one magnetic sensor may be mounted onto the substrate 11.

Electrode pads are formed on the substrate 11, the IC 12, and the magnetic sensors 13a to 13c. The substrate 11 and the IC 12 and the IC 12 and the magnetic sensors 13a to 13c are wire-bonded by wires 14. By this, the substrate 11, the IC 12, and the magnetic sensors 13a to 13c are electrically connected to each other. One of the principal surface sides of the substrate 11 is packaged by a package material 15.

Figure 2:
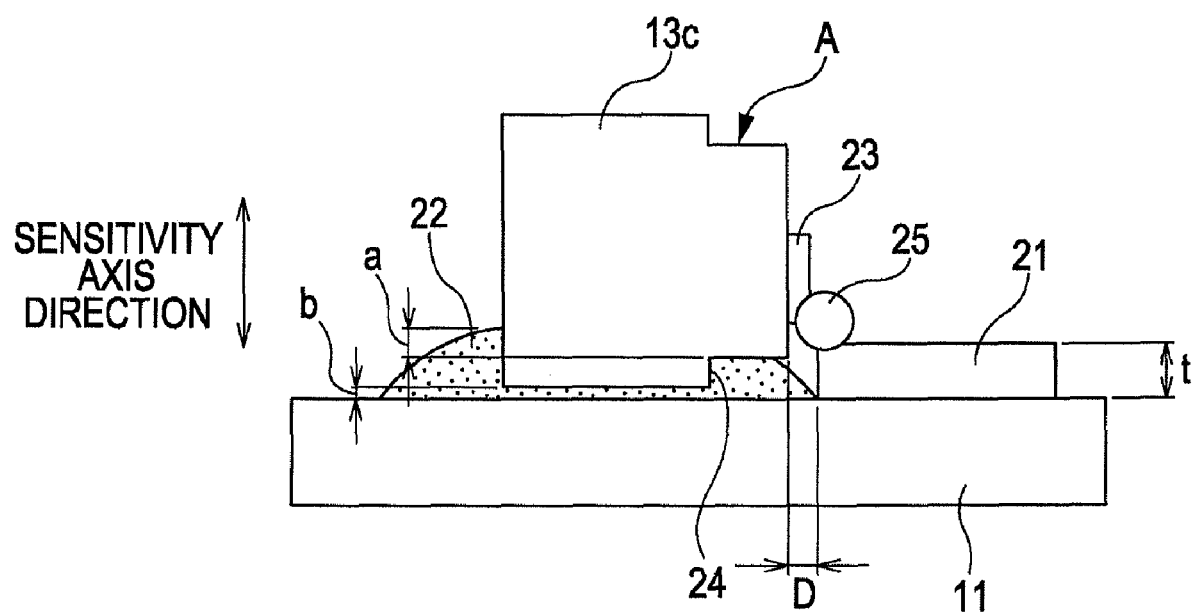
FIG. 2 shows a state in which a magnetic sensor of the magnetic sensor module shown in FIG. 1 is mounted.

FIG. 2 shows a form in which the Z-axis magnetic sensor of the magnetic sensor module shown in FIG. 1 is mounted. In the magnetic sensor module, using die-bond resin 22 as a joining material, the Z-axis magnetic sensor 13c is mounted onto the substrate 11 having a wire 21 formed on its principal surface. The Z-axis magnetic sensor 13c having electrode pads 23 formed on its bottom surface is tilted by 90 degrees and mounted onto the substrate 11. Therefore, the electrode pads 23 are positioned at a side surface thereof. Consequently, the electrode pads 23 extend substantially orthogonal to the principal surface of the substrate 11. The Z-axis magnetic sensor 13c is such that a direction along the principal surface at which the electrode pads 23 are formed corresponds to a sensitivity axis direction. Therefore, by tilting the sensor 13c by 90 degrees and mounting it to the substrate 11, the sensitivity axis direction becomes the direction substantially orthogonal to the principal surface of the substrate 11. Accordingly, the Z-axis magnetic sensor 13 has the electrode pads 23 formed on one surface thereof, is mounted to the principal surface of the substrate 11 using the die-bond resin 22 so that another surface that is orthogonal to the one surface of the Z-axis magnetic sensor 13 opposes the principal surface of the substrate 11, and has a joining material accommodation area (described later) in which the die-bond resin can fill a portion between the electrode pads 23 and the another surface.

The joining material accommodation area in which the die-bond resin can be filled is provided at the surface of the Z-axis magnetic sensor 13c opposing the principal surface of the substrate 11. This joining material accommodation area has a grooved structure 24. At the surface of the Z-axis magnetic sensor 13c opposing the principal surface of the substrate 11, the grooved structure 24 is provided at an end portion near the wire 21 formed on the substrate 11. It is desirable that the depth of a groove of the grooved structure (the size in a direction orthogonal to the principal surface of the substrate 11 in FIG. 2) be set so as to be at least smaller than a thickness t of the wire 21. By setting the depth thus, it is possible to prevent the die-bond resin 22 from flowing to a bump formation portion of the wire 21 when mounting the Z-axis magnetic sensor 13c onto the substrate 11 by the die-bond resin 22. From such a viewpoint, it is desirable that the thickness t of the wire 21 be greater than a length equal to the sum of a distance a from the electrode pads 23 to an end portion of the grooved structure 24 (that is, the distance a to an outer edge of the Z-axis magnetic sensor 13c at the joining material accommodation area) and a thickness of the die-bond resin 22 (that is, a thickness b between the substrate 11 and an area other than the joining material accommodation area of the Z-axis magnetic sensor 13c).

It is desirable that the distance from a wire-21-side end portion of the grooved structure 24 to the wire 21 be greater than the thickness of the electrode pads 23. By such a setting, when the Z-axis magnetic sensor 13c is mounted onto the substrate 11 by the die-bond resin 22, it is possible to prevent the flow of the die-bond resin 22 to the bump formation portion of the wire 21.

The wire 21 and the electrode pads 23 are electrically connected to each other by a bump (such as an Au bump) 25 serving as a joining material. By this, the Z-axis magnetic sensor 13c is mounted onto the substrate 11 by corner bump bonding.

In the magnetic sensor module having the above-described structure, the electrode pads 23 and the wire 21 can be brought close to each other. Therefore, it is possible to reduce the size of the bump 25, and to reduce the pitch between the electrode pads 23. As a result, it is possible to reduce the size of the magnetic sensor and the magnetic sensor module.

In addition, in this structure, even if the die-bond resin 22 is used, since the grooved structure 24, serving as the joining material accommodation area, is provided, the die-bond resin 22 that flows during mounting fills the grooved structure 24. This makes it possible to prevent the die-bond resin 22 from flowing out to the wire 21 and the electrode pads 23. As a result, it is possible to more reliably electrically connect the bump 25, the wire 21, and the electrode pads 23 to each other, and to increase allowable variations in the required application amount of the die-bond resin 22.

Further, in this structure, since the die-bond resin 22 fills the grooved structure 24, the difference between the amount of die-bond resin 22 at an area of the Z-axis magnetic sensor 13c opposite to the wire 21 and the amount of die-bond resin 22 that fills the grooved structure 24 can be reduced. Therefore, both sides (the wire side and the side opposite to the wire) of the Z-axis magnetic sensor 13c are held by substantially equal forces, so that it is possible to reduce tilting and positional displacement of the Z-axis magnetic sensor 13c mounted onto the substrate 11.

Figure 3:
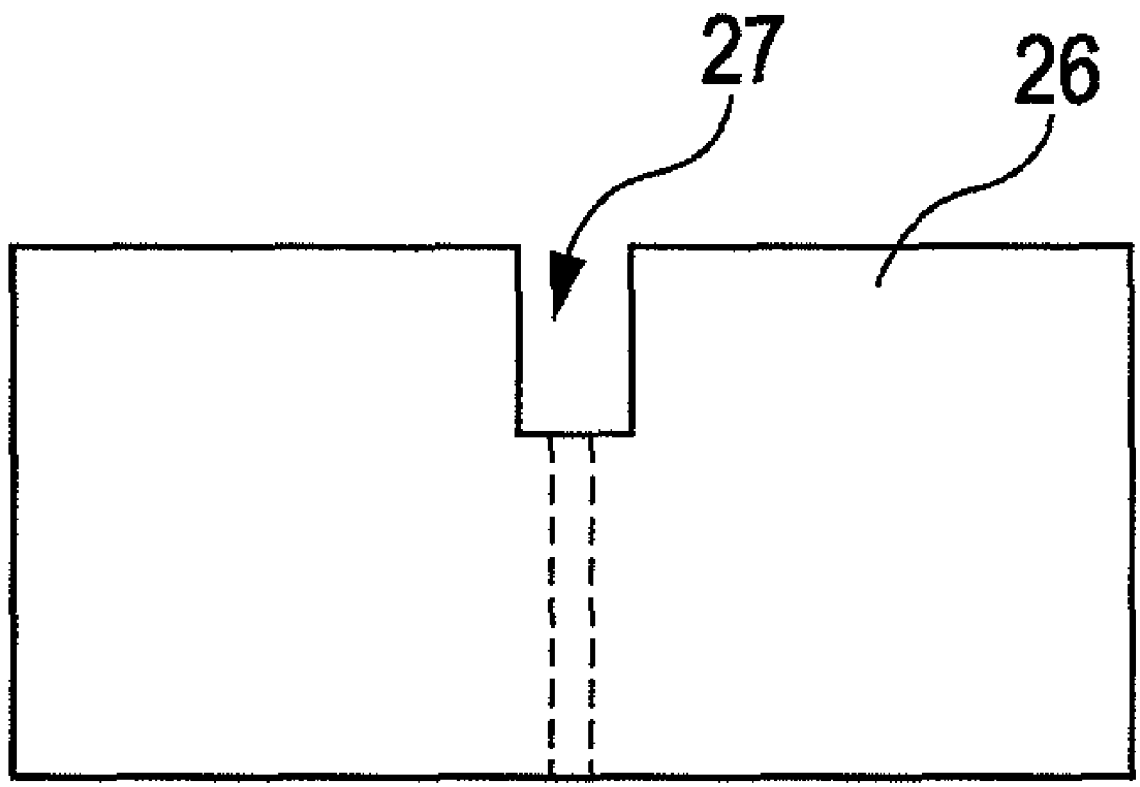
FIG. 3 illustrates the process of producing the magnetic sensor of the magnetic sensor module shown in FIG. 1.
Figure 4A:
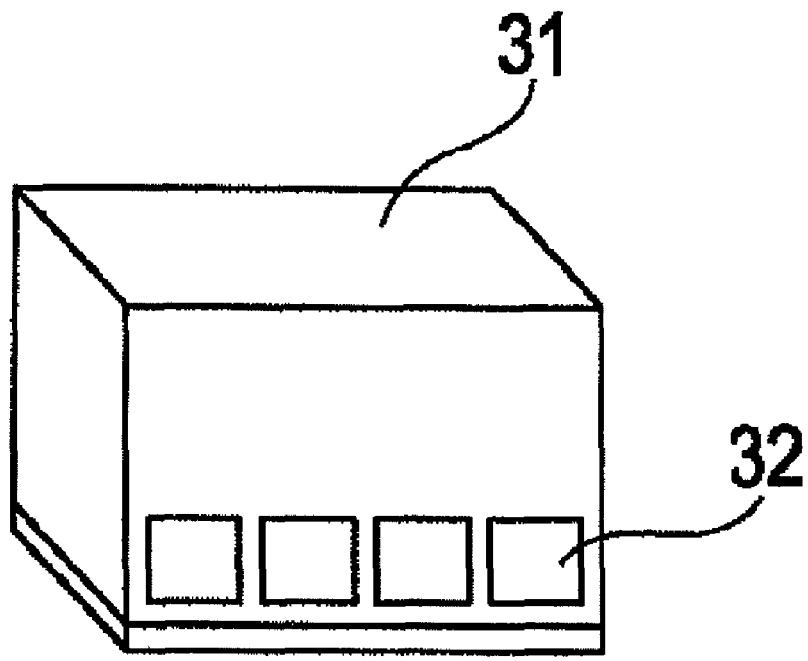
FIGS. 4A and 4B illustrate a related magnetic sensor.
Figure 4B:
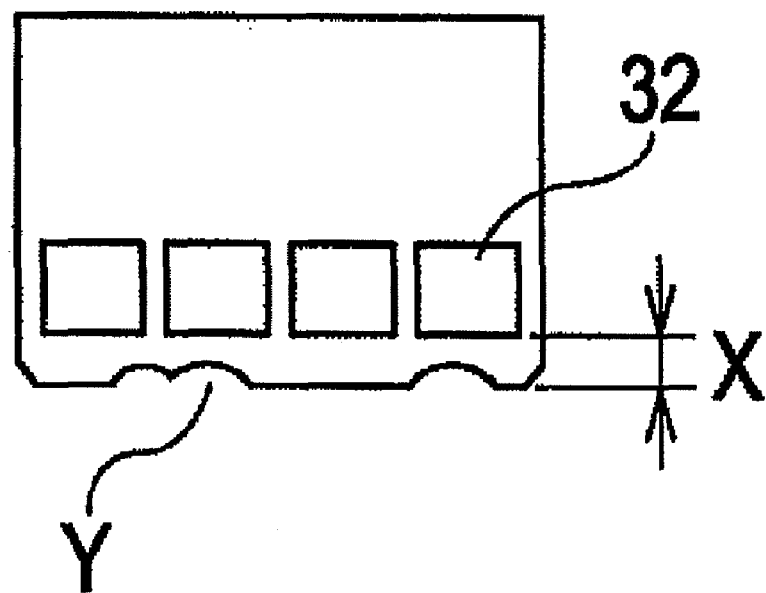
Figure 5:
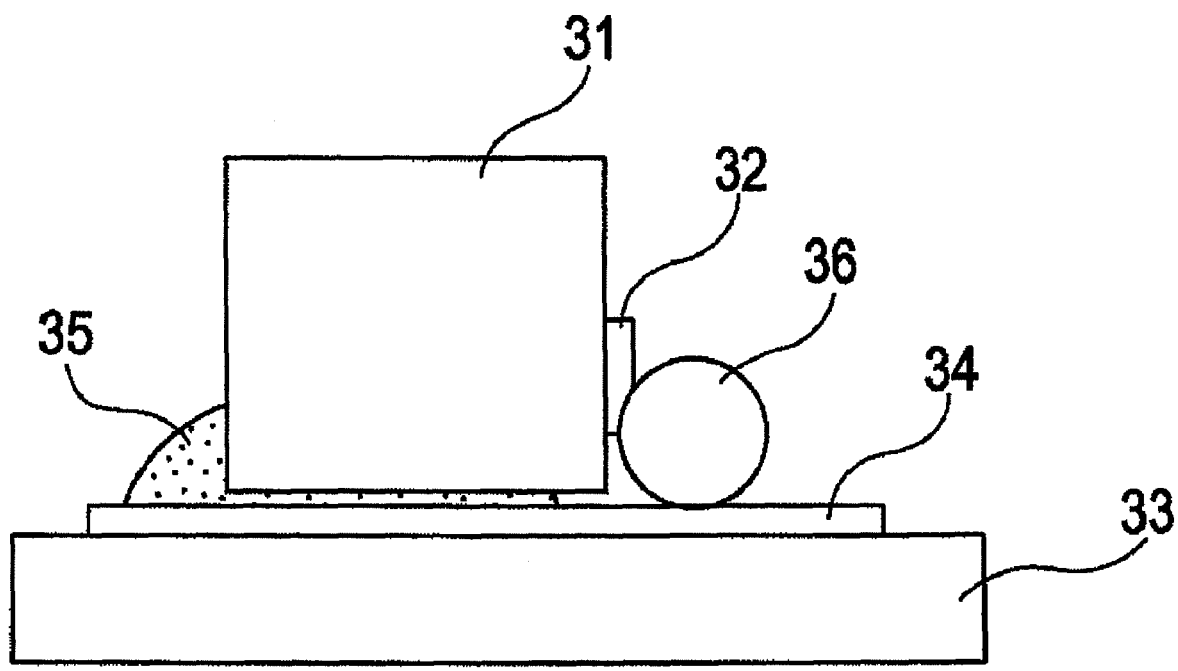
FIG. 5 shows a state in which a magnetic sensor of the related magnetic sensor module is mounted.

When the grooved structure 24 is formed in the magnetic sensor having the above-described structure, as shown in FIG. 3, first, half dicing is carried out using a dicing saw that has an edge having a relatively large width to form a groove 27 in a wafer 26 having elements formed thereon. Thereafter, dicing is carried out using a dicing saw that has an edge having a relatively small width to form a chip. By carrying out such a step cutting operation, the grooved structure 24 can be provided in the magnetic sensor. In addition, if, first, dicing is carried out under a condition in which chipping does not easily occur when the half dicing is carried out, and, then, dicing at a high speed is carried out using the dicing saw having a small width, chipping does not easily occur near the electrode pads, and dicing providing excellent productivity can be carried out. This makes it possible to set the positions of the electrode pads near an end portion of the magnetic sensor, thereby making it possible to further reduce the size of the bump 25.

Next, an example that was achieved for clarifying the advantages of the present invention will be described.

As a module substrate (interposer), a glass epoxy substrate having a wire that is 20 μm thick formed on one of the principal surfaces was provided. In addition, a magnetic sensor having electrode pads and a grooved structure such as that shown in FIG. 2 was provided. Here, the pitch between the electrode pads of the magnetic sensor was 90 μm, and the size of the grooved structure was 2 μm×30 μm. Further, the distance a to an outer edge of the magnetic sensor at the grooved structure was 7 μm.

Such a magnetic sensor was disposed so that the grooved structure faced the module substrate, and, using die-bond resin, the magnetic sensor was mounted onto the module substrate. At this time, the thickness b of the die-bond resin was 3 µm. That is, the thickness (20 µm) of the wire was greater than the length equal to the sum of the distance a (7 µm) from the electrode pads to an end portion of the grooved structure and the thickness b (3 µm) of the die-bond resin. The electrode pads and the wire of the magnetic sensor mounted in this way were subjected to corner bump bonding at an Au bump having a bump diameter of 50 µm, to produce a magnetic sensor module.

In the magnetic sensor module produced in this way, since the grooved structure was provided, the die-bond resin filled the grooved structure, and did not flow out to the wire. In addition, it was possible to carry out the corner bump bonding without short-circuiting at the Au bump. Accordingly, since it was possible to reduce the distance between the wire and the electrode pads, it was possible to reduce the bump diameter to 50 µm. Therefore, it was possible for the pitch between the electrode pads to be 90 µm. Further, since the die-bond resin holds both sides of the magnetic sensor by substantially equal forces, the chip angle of the magnetic sensor mounted on the module substrate was a predetermined angle (that is, the sensitivity axis was oriented in a predetermined direction).

The present invention is not limited to the above-described practical forms, and can be variously modified and carried out. Within the scope of the present invention, for example, the number, the disposition, and the materials of the members can be changed as appropriate to carry out the present invention. In addition, within the scope of the present invention, the present invention can be modified as appropriate to carry out the present invention.

The invention claimed is:

1. A magnetic sensor module comprising:
    a substrate having a wire on a principal surface thereof;
    a magnetic sensor having an electrode pad formed on one surface thereof, the magnetic sensor being mounted on the principal surface of the substrate using a first joining material so that another surface thereof orthogonal to the one surface opposes the principal surface of the substrate, the magnetic sensor having a joining material accommodation area that is situated between the electrode pad and the another surface and that is capable of being filled with the first joining material; and
    a second joining material electrically connecting the wire and the electrode pad to each other,
    wherein the joining material accommodation area has a grooved structure provided at an end portion near the wire.

2. The magnetic sensor module according to claim 1, wherein the magnetic sensor has a sensitivity axis in a direction substantially orthogonal to the principal surface.

3. The magnetic sensor module according to claim 1, wherein a thickness of the wire is greater than a length equal to the sum of a distance from the electrode pad to the joining material accommodation area and a thickness of the first joining material.

* * * * *